(12) United States Patent
Narushima et al.

(10) Patent No.: US 8,518,180 B2
(45) Date of Patent: *Aug. 27, 2013

(54) SILICON SINGLE CRYSTAL PULL-UP APPARATUS HAVING A SLIDING SAMPLE TUBE

(75) Inventors: Yasuhito Narushima, Nagasaki (JP); Shinichi Kawazoe, Nagasaki (JP); Fukuo Ogawa, Nagasaki (JP); Toshimichi Kubota, Nagasaki (JP); Tomohiro Fukuda, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 153 days.

This patent is subject to a terminal disclaimer.

(21) Appl. No.: 13/055,990

(22) PCT Filed: Jul. 28, 2009

(86) PCT No.: PCT/JP2009/063439
§ 371 (c)(1),
(2), (4) Date: Jan. 26, 2011

(87) PCT Pub. No.: WO2010/013718
PCT Pub. Date: Feb. 4, 2010

(65) Prior Publication Data
US 2011/0132257 A1 Jun. 9, 2011

(30) Foreign Application Priority Data
Jul. 30, 2008 (JP) ................................. 2008-195998

(51) Int. Cl.
*C30B 15/04* (2006.01)
(52) U.S. Cl.
USPC ................. 117/218; 117/11; 117/13; 117/19; 117/21; 117/200; 117/206; 117/208; 117/214; 117/217; 117/222

(58) Field of Classification Search
USPC ................. 117/11, 13, 19, 21, 200, 206, 208, 117/214, 217–218, 222, 931–932
See application file for complete search history.

(56) References Cited

U.S. PATENT DOCUMENTS 6,312,517 B1 11/2001 Banan et al.
2004/0069214 A1 4/2004 Choi et al.
(Continued)

FOREIGN PATENT DOCUMENTS

EP 2256235 12/2010
GB 797377 7/1958
(Continued)

OTHER PUBLICATIONS

U.S. Appl. No. 13/056,017 to Yasuhito Narushima et al., filed Jan. 26, 2011.

(Continued)

*Primary Examiner* — Michael Kornakov
*Assistant Examiner* — Kenneth A Bratland, Jr.
(74) *Attorney, Agent, or Firm* — Greenblum & Bernstein, P.L.C.

(57) ABSTRACT

A silicon single crystal pull-up apparatus is used to pull up a doped silicon single crystal from a melt by means of the Czochralski process and includes a pull-up furnace, a sample chamber which is externally mounted on the pull-up furnace and houses a sublimable dopant, a shielding means for thermally isolating the interior of the pull-up furnace and the interior of the sample chamber, a sample tube which can be raised and lowered between the interior of the sample chamber and the interior of the pull-up furnace, and a raising and lowering means which is provided with guide rails on which the sample tube can slide and a wire mechanism by which the sample tube is raised and lowered along the guide rails.

14 Claims, 4 Drawing Sheets

(56) References Cited

U.S. PATENT DOCUMENTS

| | | |
|---|---|---|
| 2009/0145350 A1 | 6/2009 | Narushima et al. |
| 2010/0132829 A1* | 6/2010 | Javidi et al. .................. 141/1 |
| 2011/0017948 A1* | 1/2011 | Fukuda .................. 252/182.32 |
| 2011/0120367 A1* | 5/2011 | Narushima et al. ........... 117/201 |

FOREIGN PATENT DOCUMENTS

| | | |
|---|---|---|
| JP | 59-88394 | 5/1984 |
| JP | 59088394 A * | 5/1984 |
| JP | 59-190292 A | 10/1984 |
| JP | 61-227986 | 10/1986 |
| JP | 61227986 A * | 10/1986 |
| JP | 9-227275 | 9/1997 |
| JP | 2004-137140 | 5/2004 |
| JP | 2005-247671 | 9/2005 |
| JP | 2005-336020 | 12/2005 |
| JP | 2008-87991 | 4/2008 |

OTHER PUBLICATIONS

Supplementary European Search report., dated Sep. 23, 2011 for European Patent Appl. No. 09802961.4

U.S. Office action for U.S. Appl. No. 12/597,116, mail date is Dec. 20, 2012.

* cited by examiner

SILICON SINGLE CRYSTAL PULL-UP APPARATUS HAVING A SLIDING SAMPLE TUBE

TECHNICAL FIELD

The present invention relates to a silicon single crystal pull-up apparatus, more specifically to a silicon single crystal pull-up apparatus that retains a melt in a crucible in a pulling furnace and pulls a doped silicon single crystal from a melt by Czochralski (CZ) method.

BACKGROUND ART

Conventionally, as a method for adding a dopant to a silicon crystal, a method of lowering a sample chamber housing a sublimable dopant down to a predetermined position above a melt in a pulling furnace, heating and subliming a sublimable dopant by radiant heat from the melt, and introducing the sublimable dopant, which is sublimed to the gaseous form, into the melt has been adopted.

As a method for introducing the dopant in the gaseous form to a melt, a method in which an open end of a supply pipe is disposed above the melt and the dopant carried by a carrier gas composed of an inert gas such as argon gas is sprayed from the supply pipe toward the melt, can be exemplified.

According to the invention disclosed in Patent Document 1, a sample tube (doping tube) is disposed at a position that does not interfere with a pulling mechanism and the sample tube is lowered down to just above an upper face of a crucible, thereby melting a dopant inside the sample tube by radiant heat from the melt at this position. Thereafter, the sample tube storing the dopant is lowered to a position so as to be dipped in the melt, thereby adding the melted dopant to the melt from an open surface of the doping tube. A silicon single crystal ingot having a discontinuous range of specific resistivities in a growing direction is thus pulled and grown.

[Patent Document 1] Japanese Unexamined Patent Application Publication No. 2005-336020

DISCLOSURE OF THE INVENTION

Problems to be Solved by the Invention

Patent Document 1 does not discuss in detail a method for moving a sample tube up and down. For example, since the temperature inside a pull-up apparatus is high, a sample tube may be supported and moved up and down by an elevation/descent means such as a heat-resistant arm. However, in a case of using an arm, there has been a problem in that a driving unit becomes bulky with increasing weight of the arm and a whole device for moving a sample tube up and down becomes bulky.

In addition, in a case where positioning or transfer of a sample tube is required, for example for connecting the sample tube to other supply means, the sample tube needs to be fixed at a predetermined angle or transferred. However, in such a case, fine adjustment is difficult with an arm.

The present invention aims to provide a space-saving silicon single crystal pull-up apparatus provided with an elevation/descent means that can easily correct a position of a sample tube.

Means for Solving the Problems

In a first aspect of the present invention, a silicon single crystal pull-up apparatus that pulls a doped silicon single crystal from a melt by Czochralski method, includes: a pulling furnace; a sample chamber that is externally attached to the pulling furnace and houses a sublimable dopant; a shielding means that thermally shields an inside of the sample chamber from an inside of the pulling furnace; a sample tube that can move up and down between the inside of the sample chamber and the inside of the pulling furnace; and an elevation/descent means provided with a guide rail on which the sample tube can slide and a wire mechanism that moves the sample tube up and down along the guide rail.

According to a second aspect of the present invention, in the silicon single crystal pull-up apparatus as described in the first aspect, the wire mechanism is provided with a wire that is attached to the sample tube, a drum member that winds the wire, and a driving device that drives the drum member.

According to a third aspect of the present invention, in the silicon single crystal pull-up apparatus as described in the first or second aspect, the guide rail is provided with a first guide rail that extends from the inside of the sample chamber to the shielding means and a second guide rail that extends from the shielding means to the inside of the pulling furnace, the first and second guide rails each have a groove that fits an outer diameter of the sample tube, and the groove has, in an end portion of the first guide rail on a side to the shielding means and in an end portion of the second guide rail on a side to the shielding means, a taper with an internal diameter that increases towards the end portions.

According to a fourth aspect of the present invention, the silicon single crystal pull-up apparatus as described in any one of the first to third aspects further includes a supply pipe inside the pulling furnace, which supplies the sublimable dopant discharged from the sample tube to the melt, in which the supply pipe is provided with a joint portion that is joined with the sample tube, and the sample tube, having slid downward on the guide rail, is joined with the joint portion of the supply pipe.

According to a fifth aspect of the present invention, the silicon single crystal pull-up apparatus as described in any one of the first to fourth aspects further includes a purge tube inside the pulling furnace for avoiding contamination of the melt with powder produced from sliding the sample tube on the guide rail.

According to a sixth aspect of the present invention, in the silicon single crystal pull-up apparatus as described in any one of the first to fifth aspects, the sublimable dopant is arsenic or red phosphorus.

EFFECTS OF THE INVENTION

According to the present invention, a space-saving silicon single crystal pull-up apparatus provided with an elevation/descent means that can easily correct a position of a sample tube can be provided.

PREFERRED MODE FOR CARRYING OUT THE INVENTION

Pulling Furnace

Figure 1:
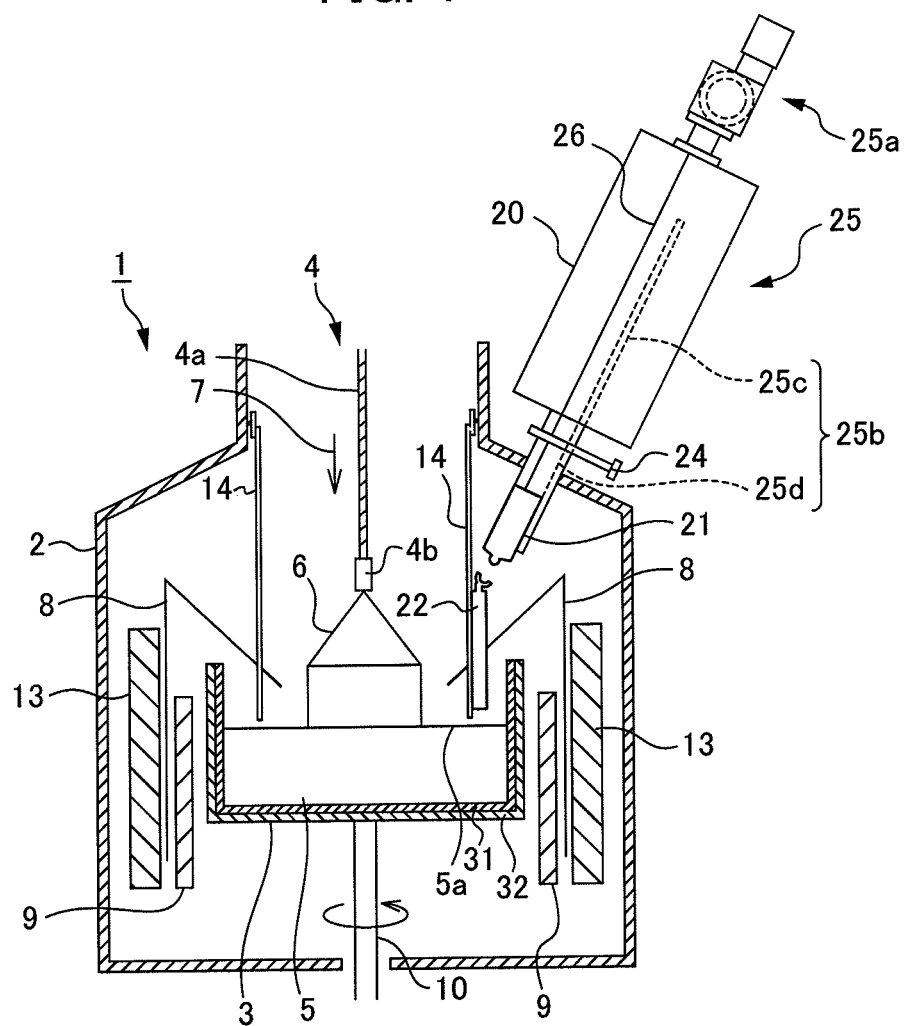
FIG. 1 is a schematic view showing a silicon single crystal pull-up apparatus according to an embodiment of the present invention.
Figure 2:
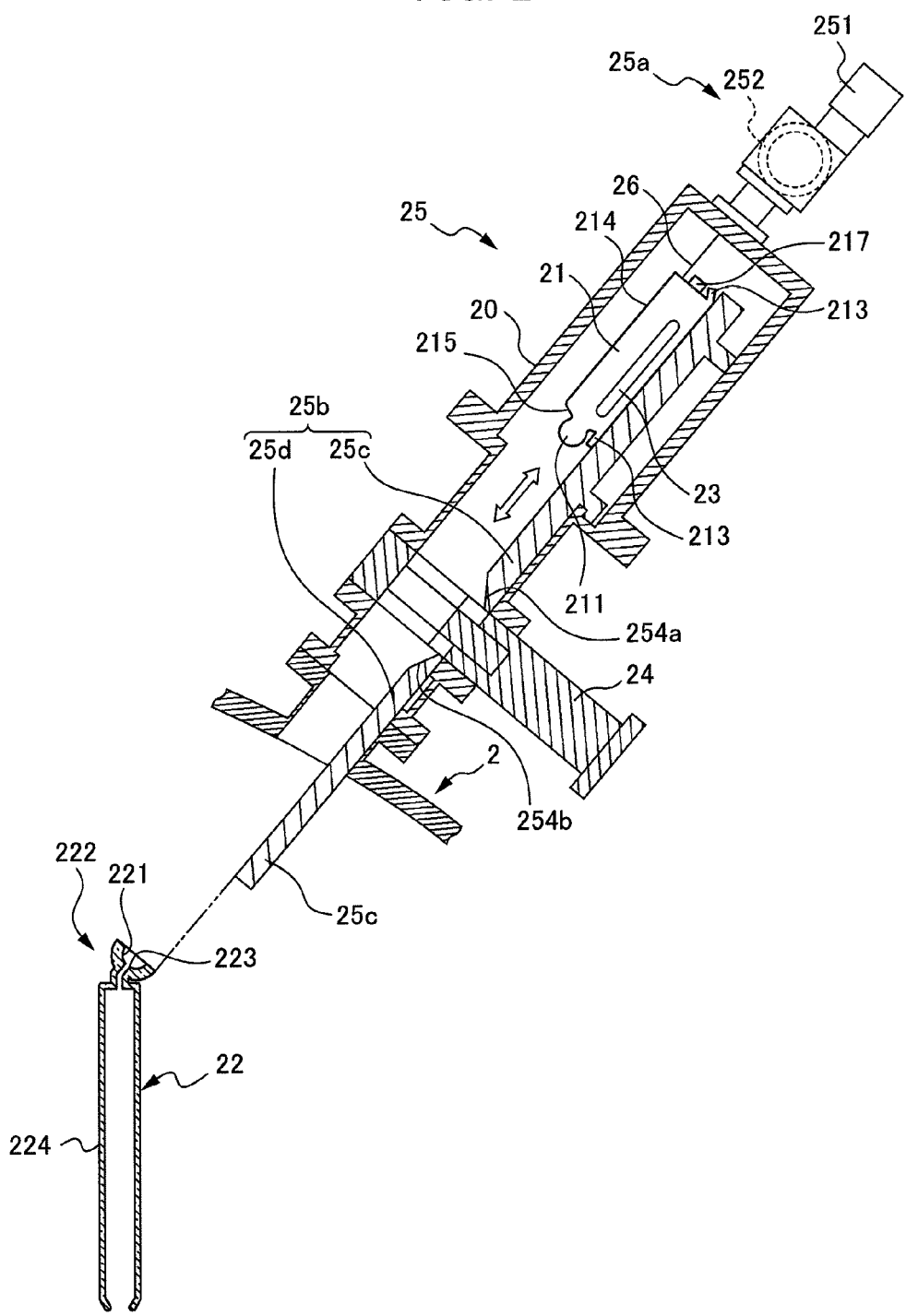
FIG. 2 is a schematic view of a cross-section showing an elevation/descent means according to the present embodiment.

An embodiment of a silicon single crystal pull-up apparatus 1 according to the present invention is described in detail hereinafter. FIG. 1 is a schematic view showing the silicon single crystal pull-up apparatus 1 according to the present embodiment. FIG. 2 is a schematic view of a cross-section showing a positional relationship between a sample chamber 20, a shielding means 24, a doping tube 21 as a sample tube, an elevation/descent means 25, and a supply pipe 22 according to the present embodiment. As shown in FIGS. 1 and 2, the silicon single crystal pull-up apparatus 1 of the present embodiment is provided with a pulling furnace (chamber) 2 that can be used for crystal growth by CZ method.

In the pulling furnace 2, a crucible 3 is provided for housing a melt 5 that is obtained by melting a material consisting of polycrystalline silicon (Si). The crucible 3 is composed of a graphite crucible 32 and a quartz crucible 31 thereinside. A heater 9 for heating and melting a material inside the crucible 3 is provided around the crucible 3. Between the heater 9 and an inner wall of the pulling furnace 2, a heat insulation tube 13 is provided.

In addition, a pulling mechanism 4 is provided above the crucible 3. The pulling mechanism 4 has a pulling cable 4*a* and a seed crystal holder 4*b* that is attached to an end thereof. The seed crystal holder 4*b* holds a seed crystal.

In such a configuration, a material is put in the crucible 3 and heated by the heater 9, thereby melting the material and obtaining the melt 5. When a melt state of the melt 5 is stabilized, the pulling cable 4*a* is lowered to dip a seed crystal (not shown) held by the seed crystal holder 4*b* into the melt 5. After settling the seed crystal in the melt 5, the pulling cable 4*a* is pulled up in order to pulling and growing the silicon single crystal (silicon ingot) 6 from the melt 5. While growing the silicon single crystal 6, the crucible 3 is rotated around a rotational axis 10. Meanwhile, the pulling cable 4*a* of the pulling mechanism 4 is rotated in the same direction as, or a different direction from, a rotational direction of the rotational axis 10. Here, the rotational axis 10 can be driven also in a perpendicular direction and can move the crucible 3 up and down to an arbitrary upper position.

At this time, the inside of the pulling furnace 2 is decompressed to a vacuum state (for example, a few KPa) after shutting down outside air. In addition, argon gas 7 is supplied as inert gas to the inside of the pulling furnace 2 and discharged using a pump. By circulating argon gas 7 inside the pulling furnace 2, vaporized material generated inside the pulling furnace 2 can be taken away to the outside of the pulling furnace 2 along with argon gas 7. A feed rate of the argon gas 7 can be set for each of steps in the crystal growth.

As the silicon single crystal 6 grows, contact area between the melt 5 and the crucible 3 changes due to a decrease in the amount of the melt 5, and the amount of dissolution of oxygen from the crucible 3 changes. This affects a concentration distribution of oxygen in the silicon single crystal 6 that is to be pulled. Given this, a heat insulation plate 8 (gas flow tube) is provided above the crucible 3 and around the silicon single crystal 6. The heat insulation plate 8 has a function of guiding the argon gas 7 that is supplied from an upper side of the pulling furnace 2 to a center of a melt surface 5*a*, and further to an outer peripheral portion of the melt surface 5*a* via the melt surface 5*a*. As a result, the argon gas 7 is discharged from an outlet (not shown) provided in a lower side of the pulling furnace 2 along with a vaporized material from the melt 5. This can stabilize a gas flow rate on the melt surface 5*a* and maintain a constant rate of oxygen evaporation from the melt 5.

In addition, the heat insulation plate 8 has a function of insulating the seed crystal and the growing silicon single crystal 6 from radiant heat generated in a high-temperature part such as the crucible 3, the melt 5, the heater 9 and the like. Here, a distance between a lower end of the heat insulation plate 8 and the melt surface 5*a* can be adjusted either by up and down movement of the crucible 3 or by up and down movement of the heat insulation plate 8 by an elevation device.

Sample Chamber

The sample chamber 20 contains a sublimable dopant 23 (impurity) that dopes the silicon single crystal 6 to be grown. The sample chamber 20 is externally attached to a flange portion of the pulling furnace 2 via a shielding means 24. Here, as the sublimable dopant 23 to be stored in the sample chamber 20, N-type dopants for providing N-type electrical characteristics to the silicon single crystal 6, such as arsenic (As), red phosphorus (P) and antimony (Sb), can be exemplified. Particularly, arsenic (As) and red phosphorous (P) are sublimable dopants and can be sublimed from a solid phase to a vapor phase at a relatively low temperature when used as the sublimable dopant 23.

When housing the sublimable dopant 23 in the sample chamber 20, it is preferable that the sublimable dopant 23 is put into the doping tube 21 as the sample tube and the doping tube 21 is housed in the sample chamber 20.

The doping tube 21 has a substantially cylindrical shape. The doping tube 21 is disposed along a groove of a guide rail 25*b* (a first guide rail 25*c* and a second guide rail 25*d*) provided to be extend from the inside of the sample chamber 20 to the inside of the pulling furnace 2. Then the doping tube 21 moves up and down from the inside of the sample chamber 20 to the inside of the pulling furnace 2 being guided by the guide rail 25*b*. Specific shapes of the doping tube 21 and the guide rail 25*b* are described later in detail.

By using the doping tube 21, the sublimable dopant 23 can be easily loaded to and unloaded from the sample chamber 20. In addition, the sublimable dopant 23 can be infallibly supplied into the pulling furnace 2 that is in operation. Here, a material that can resist high temperatures due to the radiant heat of the melt, specifically transparent quartz, can be used as a material for the doping tube 21. The doping tube 21 supplies the sublimable dopant 23 to the inside of the pulling furnace 2.

A vacuum pump (not shown) and an argon gas line (not shown) are preferably provided to the sample chamber 20. By providing the vacuum pump and the argon gas line, pressure inside the sample chamber 20 is reduced or returned to ordinary pressure, independently from the pulling furnace 2. As a result, a rapid change in pressure inside the sample chamber 20 can be reduced when a gate valve is opened or the doping tube 21 is removed.

In addition, it is preferable to provide the sample chamber 20 with a cooling mechanism. By providing the cooling mechanism, the doping tube 21 heated in the pulling furnace 2 is efficiently cooled by combination use of the cooling mechanism and the argon gas. As a result, the doping tube 21 can be exchanged more smoothly.

In addition to the shielding means 24, tubes with flanged ends can be interposed between the sample chamber 20 and the pulling furnace 2. In this case, the tube can be provided with a cooling mechanism as with the sample chamber 20, or with a small window. Particularly, by providing a tube with the small window, input of the sublimable dopant 23 can be easily confirmed.

Shielding Means

The shielding means 24 thermally shields the sample chamber 20 from the pulling furnace 2. The shielding means 24 is provided between the pulling furnace 2 and the sample chamber 20. By providing the shielding means 24, radiant heat and atmosphere of the inside of the pulling furnace 2 is thermally blocked by the shielding means 24. As a result, the sublimable dopant 23 of a desired amount can be sublimed at a desired timing. For example, the shielding means 24 can be opened during crystal growth to supply the sublimable dopant 23 from the sample chamber 20.

A sliding gate valve can be preferably used as the shielding means 24. By using the sliding gate valve, a space of the shielding means 24 in a stroke direction is reduced. Therefore, a transfer distance of the sublimable dopant 23 from the sample chamber 20 can be reduced. In this case, it is more preferable to use a cooling mechanism also in the shielding means 24. By using the cooling mechanism, the shielding means 24 does not deteriorate by heat from the pulling furnace 2. Therefore, the sample chamber 20 can be infallibly thermally shielded from the pulling surface 2.

When the shielding means 24 is closed, radiant heat of the inside of the pulling furnace 2 does not reach the sublimable dopant 23 inside the sample furnace 20 and does not vaporize the sublimable dopant 23. As a result, during a period after the beginning of growth of the silicon single crystal 6 and before first opening of the shielding means 24, the silicon single crystal 6 being grown can be maintained additive-free, without the sublimable dopant 23.

Thereafter, the shielding means 24 is opened when doping of the silicon single crystal 6 with the sublimable dopant 23 is started, in other words when the shoulder portion and a first half of the straight body portion of the silicon single crystal 6 have grown. Here, when the shielding means 24 is being opened, the sublimable dopant 23 is stored at a predetermined position in the sample chamber 20, and a door of the sample chamber 20 is closed. Thereafter, the pressure inside the pulling furnace 2 and the pressure inside the sample chamber 20 are adjusted by operating a vacuum pump on the sample chamber 20 side, and the shielding means 24 is opened. By opening the shielding means 24 to dope with the N-type sublimable dopant 23 in high concentration when a shoulder portion to a first half of the straight body portion of the silicon single crystal 6 is grown, a part from the shoulder portion to the first half of the straight body portion is free of the sublimable dopant 23 and a part from a second half of the straight body portion to a tail portion is doped with the sublimable dopant 23 in high concentration. Accordingly, the N++ type silicon single crystal 6 can be manufactured that has a resistivity of less than 0.01 Ωcm and N type electrical characteristics.

It should be noted that timing for beginning doping is not limited to the abovementioned timing. For example, doping can be started before pulling up the single crystal, in other words after a polycrystalline material inside the quartz crucible 31 is melted and before the seed crystal is dipped into the melt 5.

When the N++ type silicon single crystal 6 of low resistivity is pulled and grown by adding the sublimable dopant 23 in high concentration, breakage of crystal is likely to occur. On the other hand, according to the present embodiment, by using the shielding means 24, timing for supplying the sublimable dopant 23, which provides N-type electrical characteristics to the silicon single crystal 6, can be precisely controlled. As a result, even if growth up to the first half of the straight body portion of the silicon single crystal 6 takes an extended amount of time, breakage of crystal can be alleviated.

The shielding means 24 can be closed not only after growth of the silicon single crystal 6, but also during crystal growth, or after supplying the entire amount of the sublimable dopant 23. After closing the shielding means 24, the pressure inside the sample chamber 20 is restored to atmospheric pressure by introducing the argon gas 7 into the sample chamber 20, and then the sublimable dopant 23 can be repeatedly input by opening the door of the sample chamber 20.

Elevation/Descent Means

The elevation/descent means 25 moves the doping tube 21 up and down so as to connect the doping tube 21 with the supply pipe 22 (described later). The elevation/descent means 25 is provided with the guide rail 25b (the first guide rail 25c and the second guide rail 25d) on which the doping tube 21 can slide, and the wire mechanism 25a that moves up and down the doping tube 21 along the guide rail 25b.

The wire mechanism 25a is provided with a wire 26 that is attached to the doping tube 21, a winding drum 252 as a drum member, which winds the wire 26, and a motor 251 as a driving unit, which drives the winding drum 252. The wire mechanism 25a is a mechanism for moving the doping tube 21 up and down along the guide rail 25b with the wire 26. The wire mechanism 25a drives the winding drum 252 by the motor 251 and adjusts a height of the doping tube 21 via the wire 26. Here, driving of the motor 251 by the wire mechanism 25a is preferably controlled by a height position of the doping tube 21 and an open/close state of the shielding means 24.

The wire 26 can be stored in the winding drum 252. The wire 26 is required to have such a length that the doping tube 21 can move up and down from an end portion of the sample chamber 20 on a side to the wire mechanism 25a to the inside of the pulling furnace 2, and the length of the wire 26 is not particularly limited. The wire 26 is composed of heat-resistant metal such as molybdenum. The wire 26 is configured to be engaged with and fixed on an end portion in a longitudinal direction of the doping tube 21.

The guide rail 25b is provided with the first guide rail 25c that extends from the inside of the sample chamber 20 to the shielding means 24 and the second guide rail 25d that extends from the shielding means 24 to the inside of the pulling furnace 2. The first guide rail 25c and the second guide rail 25d are provided between the inside of the sample chamber 20 and the supply pipe 22, and define a position at which the doping tube 21 moves up and down. By providing the first guide rail 25c and the second guide rail 25d, the doping tube 21 can be connected to the supply pipe 22 more firmly, and the sublimable dopant 23 can be transferred to the supply pipe 22 more infallibly. The guide rail 25b is preferably composed of a graphite material. By using a graphite material, the guide rail 25b can be highly heat-resistant and restriction of a shape thereof can be reduced.

As shown in FIG. 1, the elevation/descent means 25 is disposed at a position that does not interfere with the silicon single crystal 6 and the pulling mechanism 4 and does not dip into the melt 5. By disposing the elevation/descent means 25 at a position that does not interfere with the pulling mechanism 4, the sublimable dopant 23 can be input while pulling the silicon single crystal 6.

Figure 3:
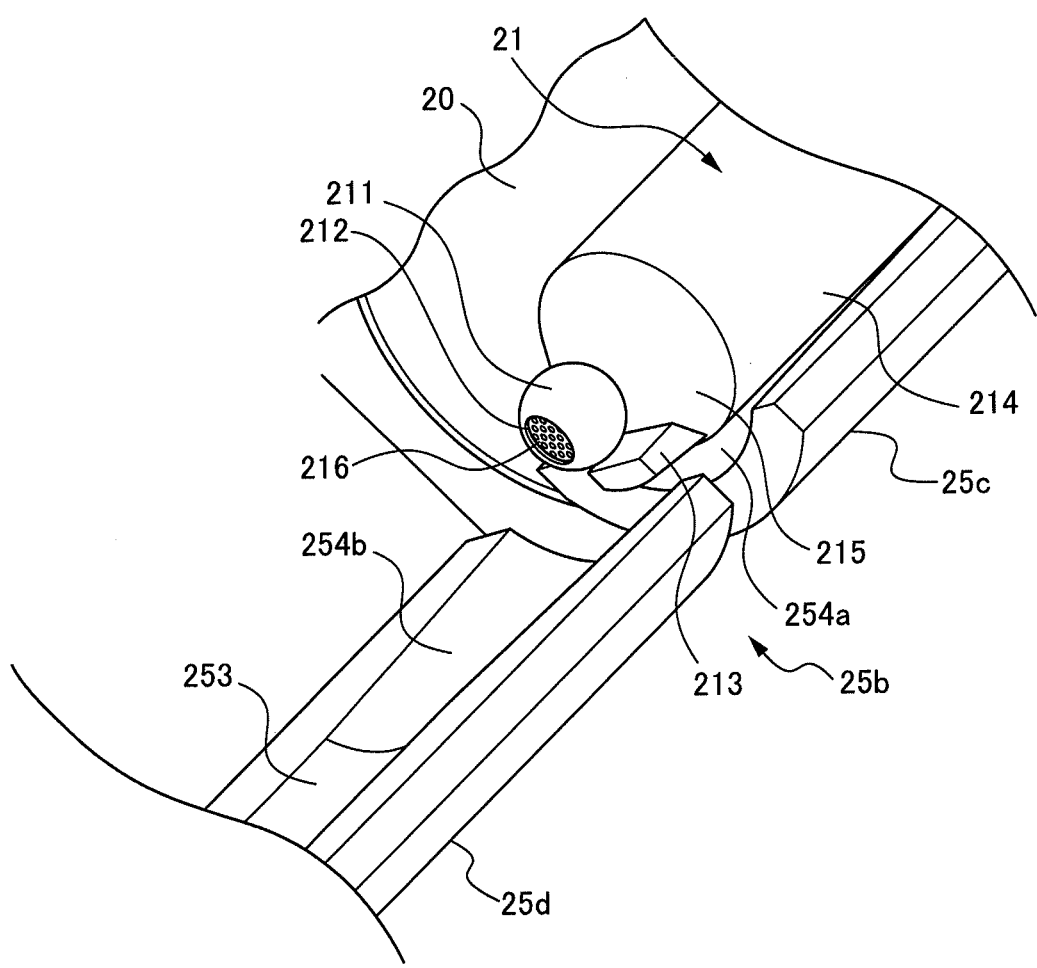
FIG. 3 is a perspective view showing an arrangement of a doping tube and a guide rail according to the present embodiment.

The shielding means 24 is provided to be orthogonal to a direction in which the first guide rail 25c and the second guide rail 25d extend from the inside of the sample chamber 20 to the inside of the pulling furnace 2. As shown in FIG. 3, a groove 253 that fits an outer diameter of the doping tube 21 is formed on each of the first guide rail 25c and the second guide rail 25d. FIG. 3 is a perspective view showing an arrangement of the doping tube 21 and the guide rail 25b. For the sake of convenience of description, the shielding means 24 between the first guide rail 25c and the second guide rail 25d is omitted. The groove 253 has a shape of a longitudinally-halved cylinder, with a substantially semicircular vertical cross-section. The groove 253 has an internal diameter that is slightly larger than the outer diameter of the doping tube 21, so that the doping tube 21 can slide.

In an end portion of the first guide rail 25c on a side to the shielding means 24 and in an end portion of the second guide rail 25d on a side to the shielding means 24, tapers 254a and 254b are formed each having an internal diameter that increases towards the end portion.

In a state where the shielding means 24 is open, a gap of a size of the shielding means 24 is formed between the first guide rail 25c and the second guide rail 25d. However, in the end portions of the first guide rail 25c and the second guide rail 25d on the side to the shielding means 24, the tapers 254a and 254b are formed each having an internal diameter that increases towards the end portion. As a result, even if the doping tube 21 is tilted while passing through the gap between the first guide rail 25c and the second guide rail 25d in a state where the shielding means 24 is open, the tilt of the doping tube 21 is corrected by the tapers 254a and 254b. Accordingly, the doping tube 21 is smoothly transferred between the first guide rail 25c and the second guide rail 25d, and can move up and down smoothly on the guide rail 25b.

Doping Tube

As shown in FIG. 3, the doping tube 21 is provided with a main body 214 that is tubular and, on a first end portion in a longitudinal direction of the doping tube 21, a convex portion 211 that projects in the longitudinal direction. The first end portion in a longitudinal direction of the doping tube 21 is an end portion of the doping tube 21 directed toward the inside of the pulling furnace 2 in a state where the doping tube 21 is disposed on the guide rail 25b (hereinafter referred to as a "lower end portion"). The convex portion 211 projects from a substantially central portion of an end surface 215 of the main body 214 of the doping tube 21 and has a substantially spherical shape. The phrase "substantially spherical shape" indicates a shape that is not a perfect sphere but a large portion thereof has a spherical curved surface.

Figure 4A:
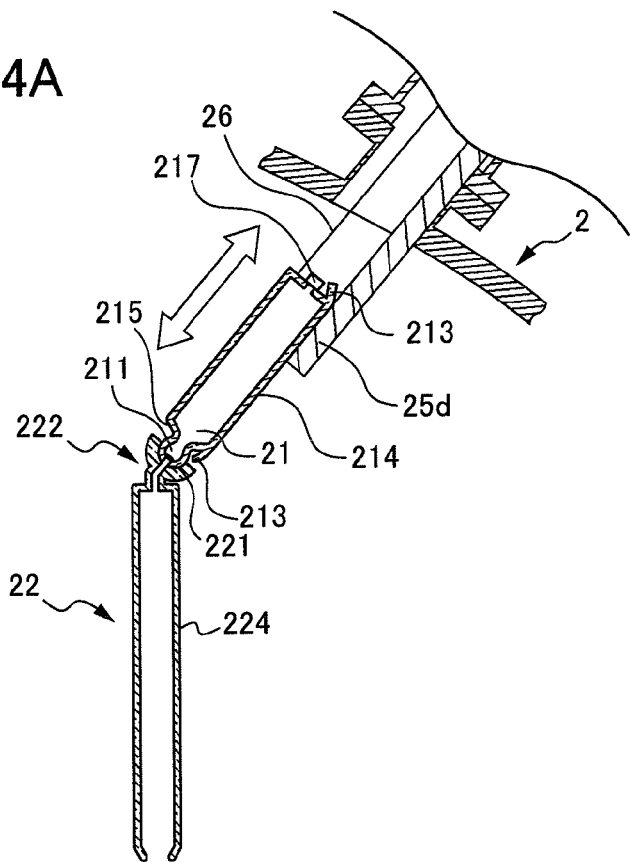
FIG. 4(*a*) is a schematic view of a cross-section in a state where the doping tube according to the present embodiment is connected to a supply pipe and FIG. 4(*b*) is a partially enlarged view of FIG. 4(*a*).
Figure 4B:
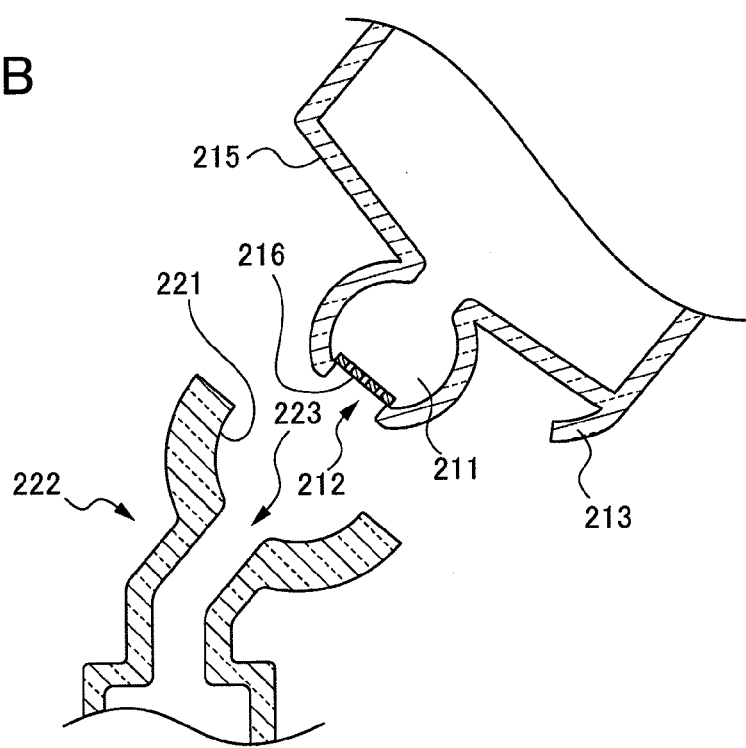

As shown in FIG. 4, the convex portion 211 is hollow. FIG. 4(a) is a schematic view of a cross-section in a state where the doping tube 21 is connected to the supply pipe 22. FIG. 4(b) is a partially enlarged view of FIG. 4(a). The doping tube 21 is provided with a through hole 212 that communicatively connects the inside of the doping tube 21 to the outside, on a lowermost portion thereof in a longitudinal direction. To the through hole 212, a plate 216, on which a plurality of holes that are smaller than the through hole 212 are formed, is attached. A diameter of each hole of the plurality of holes is approximately 2 mm. In such a configuration, the sublimable dopant 23 stored inside the doping tube 21 can be prevented from falling out from the through hole 212. When the shielding means 24 opens, the doping tube 21 slides down the guide rail 25b by a drive of the wire mechanism 25a. As shown in FIGS. 4(a) and 4(b), after sliding down, the doping tube 21 is joined with the supply pipe 22 provided inside the pulling furnace 2. When the doping tube 21 is joined with the supply pipe 22, a flow path connecting the inside of the doping tube 21 to the inside of the supply pipe 22 is formed from a hole on the plate 216 attached to the through hole 212.

In addition, the doping tube 21 is provided with a projection 213 that projects downwards in the longitudinal direction of the doping tube 21, from the end surface 215 of the main body 214. An outer surface of the projection 213 is inclined from an outer periphery side of the doping tube 21 toward the convex portion 211. A height of the projection 213 (a height from the end surface 215 in the longitudinal direction of the doping tube 21) is less than a height of the convex portion 211 (a height from the end surface 215 in the longitudinal direction of the doping tube 21). Even if the doping tube 21 is tilted while passing through the gap between the first guide rail 25c and the second guide rail 25d in a state where the shielding means 24 is open, the tilt of the projection 213 is corrected by the tapers 254a and 254b. Accordingly, the doping tube 21 is smoothly transferred between the first guide rail 25c and the second guide rail 25d, and can move up and down smoothly on the guide rail 25b.

It should be noted that, on a second end portion of the doping tube 21, an opening for loading and unloading the sublimable dopant 23 and a cap 217 for sealing the opening are provided. On the doping tube 21, the projection 213 is also provided in the second end portion as in the first end portion, for moving up and down on the guide rail 25b. Accordingly, when the doping tube 21 is pulled up by the wire mechanism 25a, the doping tube 21 can move up and down smoothly between the first guide rail 25c and the second guide rail 25d.

Supply Pipe

As shown in FIG. 4(a), the supply pipe 22 is joined with the doping tube 21 having descended by the elevation/descent means 25. The supply pipe 22 guides the sublimable dopant 23, which has vaporized by radiant heat from the melt 5 and the like, to the melt 5. The supply pipe 22 supplies the sublimable dopant 23 ejected from the doping tube 21 to the inside of the pulling furnace 2.

As shown in FIG. 1, the supply pipe 22 is disposed at a position that does not interfere with the silicon single crystal 6 and the pulling mechanism 4 and does not dip into the melt 5. As described later, on a first end of the supply pipe 22, a joint portion 222 that is joined with the convex portion 211 of the doping tube 21 is provided. Any material that can resist high temperatures due to radiant heat from the melt and the like, specifically quartz, can be used as a material for the supply pipe 22.

The supply pipe 22 is disposed at a position that does not interfere with the pulling mechanism 4. In such an arrangement, the sublimable dopant 23 that has vaporized can be guided to the melt 5 while pulling the silicon single crystal 6, thereby allowing highly accurate doping during pulling of the crystal. In addition, by disposing the supply pipe 22 at a position so as not to dip into the melt 5 and spraying the sublimable dopant 23 that has vaporized from the supply pipe 22 onto the melt 5, vibration, decrease in temperature, and change in convection of the melt 5 due to dipping of the supply pipe 22, the sublimable dopant 23 and the like into the melt 5 can be alleviated. In addition, by stabilizing a crystallization ratio of a single crystal that is being grown, an adverse effect on a crystal state of the silicon single crystal 6 that is grown can be reduced. Here, the supply pipe 22 is preferably disposed at such a position that input efficiency of the sublimable dopant 23 into the melt 5 is maximized when the sublimable dopant 23 is sprayed onto the melt 5.

As shown in FIG. 4(a), the supply pipe 22 is provided with a main body 224 that guides the sublimable dopant to the melt 5 and the joint portion 222 provided on a first end portion in a longitudinal direction of the supply pipe 22 that projects in the longitudinal direction. The first end portion is an end portion of the supply pipe 22 directed toward the second guide rail 25d in a state where the supply pipe 22 is disposed inside the pulling furnace 2 (hereinafter referred to as an "upper end portion"). As shown in FIG. 4(b), the joint portion 222 includes a concave portion 221 that has a concave shape into which the convex portion 211 of the doping tube 21 can fit. The convex portion 211 of the doping tube 21 and the concave portion 221 of the supply pipe 22 compose a ball joint structure as a joint means for joining the doping tube 21 with the supply pipe 22. The concave portion 221 is disposed on a track of the first guide rail 25c and the second guide rail 25d so as to fit onto and to be joined with the convex portion 211 of the doping tube 21 that has slid down the second guide rail 25d.

An inner surface of the concave portion 221 is a contacting surface with the convex portion 211 of the doping tube 21. The contacting surface is formed to be a curved surface. The inner face of the concave portion 221 has a curved shape corresponding to an outer face of the convex portion 211 of the doping tube 21. A hole 223 is formed in the deepest part of the concave portion 221, the hole 223 being connected to the supply pipe 22 that is hollow. When the doping tube 21 is joined with the supply pipe 22, a flow path connecting the inside of the doping tube 21 to the inside of the supply pipe 22 is formed, thereby guiding the vaporized sublimable dopant to the melt 5.

Purge Tube

As shown in FIG. 1, a purge tube 14 is provided from an upper side to a lower side in the pulling furnace 2. The purge tube 14 extends downwards from the upper side of the pulling furnace 2, and further extends from the joint portion of the supply pipe 22 to an upper surface of the melt 5 along the supply pipe 22. The purge tube 14 prevents carbon powder, which is powder generated from the guide rail 25b due to friction when the doping tube 21 moves up and down along the guide rail 25b, from contaminating the melt 5.

Next, an example of an in use state of the silicon single crystal pull-up apparatus 1 according to the present embodiment is described with reference to FIGS. 2 to 4. The sublimable dopant 23 is supplied into the doping tube 21. During input of the sublimable dopant 23, the shielding means 24 is closed and pressure inside the sample chamber 20 is equal to atmospheric pressure. After input of the sublimable dopant 23 into the doping tube 21, the pressure inside the sample chamber 20 is adjusted to predetermined pressure and the shielding means 24 is opened.

The doping tube 21 is connected to the wire 26 of the wire mechanism 25a. A motor 251 of the wire mechanism 25a drives the winding drum 252 and reels out the wire 26. As a result, the doping tube 21 connected to the wire 26 descends. When the shielding means 24 is open, the doping tube 21 descends along the first guide rail 25c and the second guide rail 25d.

In a state where the shielding means 24 is open, a gap is formed between the first guide rail 25c and the second guide rail 25d. However, in an end portion of the first guide rail 25c on a side to the shielding means 24 and in an end portion of the second guide rail 25d on a side to the shielding means 24, tapers 254a and 254b are formed each having an internal diameter that increases towards the end portion. As a result, even if the doping tube 21 is tilted while passing through the gap between the first guide rail 25c and the second guide rail 25d in a state where the shielding means 24 is open, the tilt of the doping tube 21 is corrected by the tapers 254a and 254b. Accordingly, the doping tube 21 is smoothly transferred between the first guide rail 25c and the second guide rail 25d, and can move up and down smoothly on the guide rail 25b.

In addition, the projection 213 that is inclined from the outside toward the inside of the doping tube 21 is provided in an end portion in a longitudinal direction of the doping tube 21, thus the doping tube 21 can move up and down more smoothly.

The doping tube 21 descends along the groove 253 formed on the guide rail 25b. The doping tube 21 is supported by the wire 26 and passes through an end portion of the second guide rail 25d on a side to the pulling furnace 2. The doping tube 21 having descended on the guide rail 25b is connected to the joint portion 222 of the supply pipe 22 that is disposed on an extended line of the groove 253. The convex portion 211 provided in a lower end portion of the doping tube 21 is guided by the guide rail 25b and engaged with the concave portion 221 provided in an upper end portion of the supply pipe 22.

In a lowermost portion of the convex portion 211, the through hole 212 is provided. To the through hole 212, the plate 216 having the plurality of holes is attached. On the other hand, the deepest part of the concave portion 221 is the hole 223, which is connected to the inside of the supply pipe 22. Accordingly, a flow path is formed between the doping tube 21 and the supply pipe 22 when the convex portion 211 is engaged with the concave portion 221. The vaporized sublimable dopant 23 inside the doping tube 21 flows into the supply pipe 22 via the flow path and is sprayed onto an upper surface of the melt 5 below the supply pipe 22.

In this case, since the convex portion 211 and the concave portion 221 as the joint means are in a ball joint structure, even if there is a slight misalignment in the angle at which the doping tube 21 is connected to the supply pipe 22, the angle can be changed in a state in which the convex portion 211 is engaged with the concave portion 221. In addition, since the guide rail 25b is provided in an inclined state toward the inside of the pulling furnace 2 and the weight of the doping tube 21 having slid on the inclined guide rail 25b is applied to the convex portion 211, the convex portion 211 and the concave portion 221 contact each other more tightly.

The silicon single crystal pull-up apparatus of the present embodiment provides the following effects. Since the doping tube 21 is moved up and down by the wire mechanism 25a in the present embodiment, an elevation/descent means for moving the doping tube 21 up and down can be reduced in size and weight compared to a case of using an arm and the like. In addition, the elevation/descent means having a simple configuration can be easily maintained, repaired and the like. Furthermore, since the doping tube 21 moves up and down in a state of being guided by the guide rail 25b, by adjusting an angle and position of the guide rail 25b when connecting the doping tube 21 to the supply pipe 22, an angle and position of the doping tube 21 can be finely adjusted.

In the present embodiment, in the end portions of the first guide rail 25c and the second guide rail 25d on the side to the shielding means 24, the tapers 254a and 254b are formed each having an internal diameter that increases towards the end portion. As a result, even if the doping tube 21 is tilted while passing through the gap between the first guide rail 25c and the second guide rail 25d in a state where the shielding means 24 is open, the tilt of the doping tube 21 is corrected by the tapers 254a and 254b. Accordingly, the doping tube 21 is smoothly transferred between the first guide rail 25c and the second guide rail 25d, and can move up and down smoothly on the guide rail 25b.

In the present embodiment, the purge tube 14 is disposed inside the pulling furnace 2. Since the guide rail 25b is composed of a graphite material, carbon powder is generated when the doping tube 21 slides on the guide rail 25b. By providing the purge tube 14, the carbon powder can be prevented from contaminating the melt 5.

It should be noted that an embodiment of the present invention and a technical scope of the present invention are not limited to the above described embodiments.

For example, although the sublimable dopant 23 is supplied to the melt 5 by a spraying method in the embodiment, the present invention is not limited thereto and a dipping method that dips the supply pipe 22 into the melt 5 can also be used for supplying the sublimable dopant 23 to the melt 5.

In addition, a carrier gas introduction pipe (not shown) can also be used. The carrier gas introduction pipe is to be communicatively connected to the doping tube 21. The carrier gas introduction pipe is to introduce carrier gas that is supplied from a gas supply source (not shown) for transferring a dopant into the doping tube 21. By introducing the carrier gas, the sublimable dopant 23 that has vaporized can be efficiently guided to the melt 5 via the supply pipe 22 without retention in the doping tube 21. The carrier gas introduction pipe is composed of, for example, quartz. Inert gas such as argon gas is used as the carrier gas.

The invention claimed is:

1. A silicon single crystal pull-up apparatus that pulls a doped silicon single crystal from a melt by Czochralski method, the apparatus comprising:
    a pulling furnace;
    a sample chamber that is externally attached to the pulling furnace and houses a sublimable dopant;
    a shielding means that thermally shields an inside of the sample chamber from an inside of the pulling furnace;
    a sample tube that can move up and down between the inside of the sample chamber and the inside of the pulling furnace;
    an elevation/descent means provided with a guide rail on which the sample tube can slide and a wire mechanism that moves the sample tube up and down along the guide rail; and
    a supply pipe inside the pulling furnace, the supply pipe configured to supply the dopant discharged from the sample tube to the melt, wherein:
        the supply pipe comprises a concave-shaped sample tube receiver, and
        the sample tube comprises a substantially spherical-shaped doping projection configured to matingly contact the sample tube receiver when the sample tube moves down along the guide rail, the doping projection further configured to disengage from the sample tube receiver when the sample tube moves up along the guide rail.

2. The silicon single crystal pull-up apparatus according to claim 1,
    wherein the wire mechanism is provided with a wire that is attached to the sample tube, a drum member that winds the wire, and a driving device that drives the drum member.

3. The silicon single crystal pull-up apparatus according to claim 1,
    wherein the guide rail is provided with a first guide rail that extends from the inside of the sample chamber to the shielding means and a second guide rail that extends from the shielding means to the inside of the pulling furnace, the first and second guide rails each have a groove that fits an outer diameter of the sample tube, and the groove has, in an end portion of the first guide rail on a side to the shielding means and in an end portion of the second guide rail on a side to the shielding means, a taper with an internal diameter that increases towards the end portions.

4. The silicon single crystal pull-up apparatus according to claim 1, further comprising a purge tube inside the pulling furnace for avoiding contamination of the melt with powder produced from sliding the sample tube on the guide rail.

5. The silicon single crystal pull-up apparatus according to claim 1, wherein the sublimable dopant is arsenic or red phosphorus.

6. A silicon single crystal pull-up apparatus that pulls a doped silicon single crystal from a melt by Czochralski method, the apparatus comprising:
    a pulling furnace;
    a sample chamber that is externally attached to the pulling furnace and houses a sublimable dopant;
    a shielding means that thermally shields an inside of the sample chamber from an inside of the pulling furnace;
    a sample tube that can move up and down between the inside of the sample chamber and the inside of the pulling furnace;
    an elevation/descent means provided with a guide rail on which the sample tube can slide and a wire mechanism that moves the sample tube up and down along the guide rail, wherein the wire mechanism is provided with a wire that is attached to the sample tube, a drum member that winds the wire, and a driving device that drives the drum member; and
    a supply pipe inside the pulling furnace, the supply pipe configured to supply the dopant discharged from the sample tube to the melt, wherein:
        the supply pipe comprises a concave-shaped sample tube receiver, and
        the sample tube comprises a substantially spherical-shaped doping projection configured to matingly contact the sample tube receiver when the sample tube moves down along the guide rail, the doping projection further configured to disengage from the sample tube receiver when the sample tube moves up along the guide rail.

7. A silicon single crystal pull-up apparatus that pulls a doped silicon single crystal from a melt by Czochralski method, the apparatus comprising:
    a pulling furnace;
    a sample chamber that is externally attached to the pulling furnace and houses a sublimable dopant;
    a shield configured to thermally shield an inside of the sample chamber from an inside of the pulling furnace;
    a sample tube movable up and down between the inside of the sample chamber and the inside of the pulling furnace; and
    an elevator provided with a guide rail on which the sample tube can slide and a wire that moves the sample tube up and down along the guide rail; and
    a supply pipe inside the pulling furnace, the supply pipe configured to supply the dopant discharged from the sample tube to the melt, wherein:
        the supply pipe comprises a concave-shaped sample tube receiver, and the sample tube comprises a substantially spherical-shaped doping projection configured to matingly contact the sample tube receiver when the sample tube moves down along the guide rail, the doping projection further configured to disengage from the sample tube receiver when the sample tube moves up along the guide rail.

8. The silicon single crystal pull-up apparatus according to claim 7, wherein the wire is provided with a sample tube wire that is attached to the sample tube, a drum member that winds the sample tube wire, and a driving device that drives the drum member.

9. The silicon single crystal pull-up apparatus according to claim 7, wherein the guide rail is provided with a first guide rail that extends from the inside of the sample chamber to the shield and a second guide rail that extends from the shield to the inside of the pulling furnace, the first and second guide rails each have a groove that fits an outer diameter of the sample tube, and the groove has, in an end portion of the first guide rail on a side to the shield and in an end portion of the second guide rail on a side to the shield, a taper with an internal diameter that increases towards the end portions.

10. The silicon single crystal pull-up apparatus according to claim 7, further comprising a purge tube inside the pulling furnace and configured to avoid contamination of the melt with powder produced from sliding the sample tube on the guide rail.

11. The silicon single crystal pull-up apparatus according to claim 7, wherein the sublimable dopant is arsenic or red phosphorus.

12. A silicon single crystal pull-up apparatus that pulls a doped silicon single crystal from a melt, the apparatus comprising:

a pulling furnace;

a sample chamber externally attached to the pulling furnace;

a shield configured to thermally shield an inside of the sample chamber from an inside of the pulling furnace;

a sample tube movable up and down between the inside of the sample chamber and the inside of the pulling furnace, the sample tube configured to house a dopant; and an elevator comprising:

a guide groove on which the sample tube is slidable, the guide groove being divided into a first guide groove and a second guide groove by the shield, the shield slidable in a direction orthogonal to the moving direction of the sample tube;

a mechanically operated winding spool;

a wire having a first end connected to a distal end of the sample tube and having a second end connected to the winding spool, such that rotation of the winding spool in a first direction winds the wire about the winding spool such that the sample tube moves along the guide groove up toward the winding spool, and such that rotation of the winding spool in a second direction unwinds the wire from the winding spool such that the sample tube moves along the guide groove down toward the inside of the sample chamber; and a supply pipe inside the pulling furnace, the supply pipe configured to supply the dopant discharged from the sample tube to the melt, wherein:

the supply pipe comprises a concave-shaped sample tube receiver, and the sample tube comprises a substantially spherical-shaped doping projection configured to matingly contact the sample tube receiver when the sample tube moves down along the guide groove, the doping projection further configured to disengage from the sample tube receiver when the sample tube moves up along the guide groove.

13. The silicon single crystal pull-up apparatus according to claim 12, wherein:

the first guide groove and the second groove each has a ramp facing the shield, each ram having an internal diameter that increases towards the shield; and the sample tube has a prow on each opposite end of the sample tube, each prow configured to engage a respective ramp of the first guide groove and the second guide groove during sliding of the sample tube.

14. The silicon single crystal pull-up apparatus according to claim 12, wherein:

the first guide groove and the second groove each has a ramp facing the shield, each ram having an internal diameter that increases towards the shield;

the sample tube has a prow on a proximal end and the distal end of the sample tube, each prow configured to engage a respective ramp of the first guide groove and the second guide groove during sliding of the sample tube; and the doping projection protrudes beyond the prow located on the distal end of the sample tube.

* * * * *